(12) United States Patent
Burke et al.

(10) Patent No.: US 7,674,682 B2
(45) Date of Patent: Mar. 9, 2010

(54) CAPACITOR INTEGRATION AT TOP-METAL LEVEL WITH A PROTECTIVE CLADDING FOR COPPER SURFACE PROTECTION

(75) Inventors: Edmund Burke, Dallas, TX (US); Satyavolu S. Papa Rao, Garland, TX (US); Timothy A. Rost, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 557 days.

(21) Appl. No.: 10/697,138

(22) Filed: Oct. 30, 2003

(65) Prior Publication Data

US 2005/0093093 A1 May 5, 2005

(51) Int. Cl.
*H01L 21/331* (2006.01)
(52) U.S. Cl. .................. 438/396; 438/393; 257/E21.02; 257/E21.011
(58) Field of Classification Search .................. 438/396, 438/393; 257/E21.02, E21.011, E21.015, 257/E21.017, E21.021
See application file for complete search history.

(56) References Cited

U.S. PATENT DOCUMENTS

| 5,120,572 | A | * | 6/1992 | Kumar ......................... 216/16 |
| 5,506,166 | A | * | 4/1996 | Sandhu et al. .............. 438/396 |
| 6,117,747 | A | * | 9/2000 | Shao et al. .................. 438/396 |
| 6,200,629 | B1 | * | 3/2001 | Sun .............................. 427/79 |
| 6,261,917 | B1 | * | 7/2001 | Quek et al. .................. 438/396 |
| 6,429,474 | B1 | * | 8/2002 | Gambino et al. ............. 257/296 |
| 6,876,028 | B1 | * | 4/2005 | Coolbaugh et al. .......... 257/306 |
| 7,033,882 | B2 | * | 4/2006 | Block et al. ................. 438/238 |
| 2004/0184217 | A1 | * | 9/2004 | List et al. ................. 361/306.2 |

* cited by examiner

*Primary Examiner*—Caridad M Everhart
(74) *Attorney, Agent, or Firm*—Jacqueline J. Garner; Wade J. Brady, III; Frederick J. Telecky, Jr.

(57) ABSTRACT

An on-chip decoupling capacitor (106) and method of fabrication. The decoupling capacitor (106) is integrated at the top metal interconnect level (104) and includes surface protection cladding (109) for the copper metal (104*b*) of the top metal interconnect.

7 Claims, 3 Drawing Sheets

CAPACITOR INTEGRATION AT TOP-METAL LEVEL WITH A PROTECTIVE CLADDING FOR COPPER SURFACE PROTECTION

CROSS-REFERENCE TO RELATED APPLICATIONS

The following co-pending patent applications are related and hereby incorporated by reference:

U.S. patent application Ser. No. 10/696,816, filed Oct. 30, 2003 to Rost et al.

U.S. patent application Ser. No. 10/697,139, filed Oct. 30, 2003 to Papa Rao et al.

FIELD OF THE INVENTION

The invention is generally related to the field of forming capacitors in semiconductor devices and more specifically to forming high density capacitors at the top metal interconnect level.

BACKGROUND OF THE INVENTION

As semiconductor technology continues to scale, the supply or operating voltage of the integrated circuit becomes lower and lower. The nominal supply voltage has decreased from 5V to 3.3V to 1.8V and below. Transistors with operating voltages of 1.1V are currently being developed.

As the supply voltage decreases it becomes increasingly important to limit the voltage swing on the supply voltage lines. This is due to the fact that smaller voltage swings can cause unacceptable amounts of current leakage and even unintentionally switch the state of the transistor. Voltage swing may be minimized by providing capacitance on the power supply. Typically this is accomplished with off-chip decoupling capacitors. As the amount of voltage swing that can be tolerated is reduced, more and more decoupling capacitance is required.

SUMMARY OF THE INVENTION

The invention is an on-chip decoupling capacitor and method of fabrication. The decoupling capacitor is integrated at the top metal interconnect level and includes a protective cladding for surface protection of the top metal interconnect.

An advantage of the invention is providing on-chip decoupling capacitance with surface protection for the metal.

This and other advantages will be apparent to those of ordinary skill in the art having reference to the specification in conjunction with the drawings.

DETAILED DESCRIPTION OF THE EMBODIMENTS

The invention will now be described in conjunction with copper damascene process utilizing an aluminum cap layer. Those of ordinary skill in the art will appreciate that the benefits of the invention can be applied to other metal interconnect processes.

As semiconductor devices continue to scale, the decoupling capacitance requirements increase significantly. The parasitic resistance of off-chip capacitance can result in performance penalties. Placing the decoupling capacitors on-chip can reduce or even avoid these performance penalties. However, integrating the decoupling capacitors on-chip can cause other concerns. For example, using a gate oxide capacitor (in which a MOSFET gate oxide layer is also used as the capacitor dielectric) consumes active area. There are also leakage concerns with gate oxide capacitors. Adding a capacitor between contact and M1 (the first level of metal interconnect) adds a mask, may require routing restrictions above the capacitor and causes planarity and thermal budget concerns. Adding a capacitor between metal interconnect lines also causes planarity and thermal budget concerns.

To alleviate some of these concerns, the preferred embodiment of the invention incorporates a high density capacitor at the top metal interconnect level with surface protection for the copper interconnect. The top metal interconnect level is generally used for routing power and ground lines. As such, the interconnect routing is not as dense as the lower metal interconnect levels and there is more space available for forming the decoupling capacitors. Furthermore, since it is the uppermost interconnect level, planarity is not as much of a concern. Thermal budget is also less of a concern because there are fewer remaining steps and those steps remaining are generally performed at lower temperatures.

Figure 1:
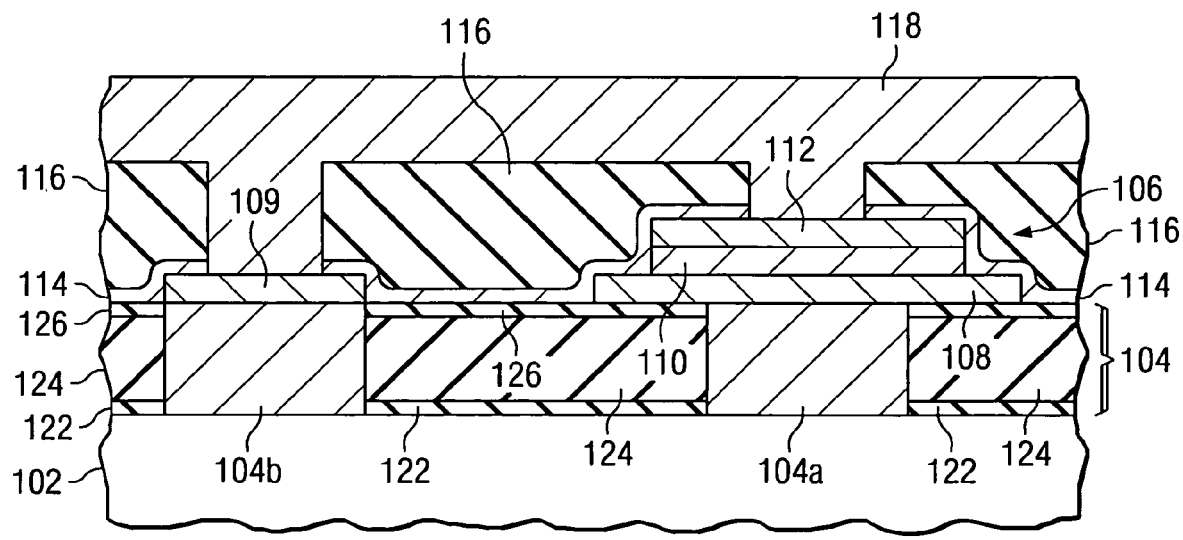
FIG. 1 is a cross-sectional diagram of a high density capacitor according to an embodiment of the invention.

A preferred embodiment of the invention is shown in FIG. 1. A high density capacitor 106 is formed above the top metal interconnect level 104 between the top metal interconnect level 104 and the aluminum cap layer 118. Aluminum cap layer 118 provides a bonding surface which offers better adhesion for ball bonds, bond wires, etc. than copper. Bonding typically occurs during packaging of the integrated circuit to provide connection to the semiconductor device. So, while the aluminum cap layer is metal, it is not considered a metal interconnect level, but merely a capping layer to provide better connection during packaging to the top metal interconnect level 104.

Top metal interconnect level 104 is formed over semiconductor body 102. Semiconductor body 102 comprises a semiconductor substrate, transistors and other devices, as well as other metal interconnect levels. Only the top metal interconnect level 104 is shown for simplicity. In this embodiment, the top metal interconnect level 104 comprises copper interconnect lines 104a, 104b with appropriate barrier layers.

High density capacitor 106 comprises a bottom electrode 108, capacitor dielectric 110, and top electrode 112. The top 112 and bottom 108 electrodes comprise an electrically conductive material. In the preferred embodiment, TaN is used. TaN is often used as a barrier in copper interconnects and offers good compatibility with copper processes. Other electrically conductive materials, such as TiN, Ir, Ru, Ta and combinations thereof may alternatively be used. Although TaN is used for both the top and bottom electrodes in the preferred embodiment, different materials may in fact be used for the top and bottom electrodes. The capacitor dielectric 110 preferably comprises a high dielectric constant dielectric. In the preferred embodiment, tantalum-oxide is used. Other high-k dielectrics such as hafnium oxide may alternatively be used. While high-k dielectrics are preferred, less high-k materials such as SiN can alternatively be used.

The material of bottom electrode 108 is also used as cladding 109 over all the metal interconnect lines, such as 104b. Cladding 109 protects the surface of the copper during the capacitor 106 formation, specifically during the etches.

The high density capacitor 106 is located over first metal interconnect line 104a such that first metal interconnect line 104a is electrically connected to the bottom electrode 108. Connection to the top electrode 112 is made via aluminum cap layer 118. A portion of the aluminum cap layer 118 is electrically connected between the top electrode 112 and a second metal interconnect line 104b. So, for example, first metal interconnect line 104a may be designed as power supply line for which capacitive decoupling is desired and second metal interconnect line 104b may be designed as a ground line.

Figure 2A:
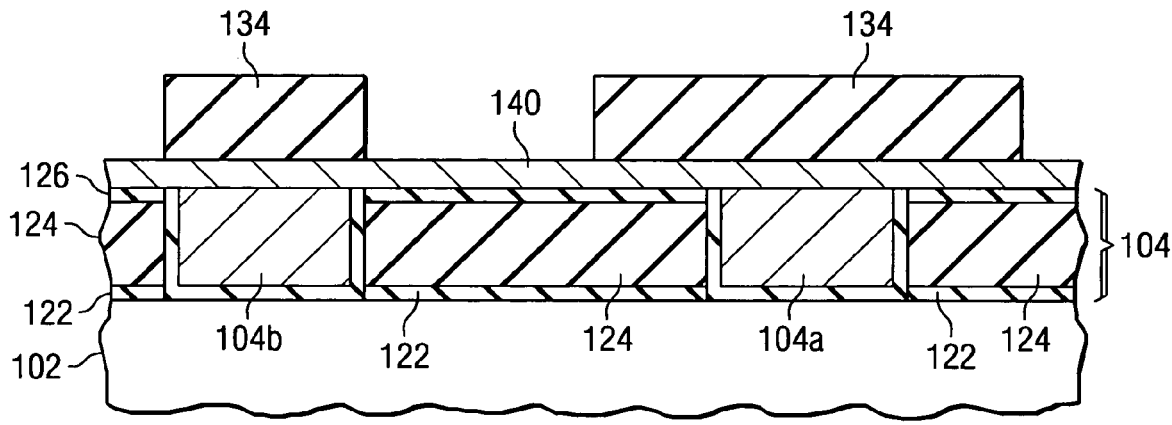
FIGS. 2A-2F are cross-sectional diagrams of the high density capacitor of FIG. 1 at various stages of fabrication.

A method for fabricating the decoupling capacitor of FIG. 1 will now be discussed with reference to FIGS. 2A-2F. A semiconductor body 102 is processed through the formation of top metal interconnect level 104, as shown in FIG. 2A. Semiconductor body 102 comprises a semiconductor (e.g., silicon) substrate, transistors, and other devices as well as one or more metal interconnect levels. Only the top metal interconnect level 104 is shown for simplicity. The top metal interconnect level 104 may be formed by depositing an etchstop layer 122 (e.g., SiN or SiC), depositing a low-k dielectric layer 124 (e.g., organo-silicate glass or fluorine-doped silicon-oxide glass) and depositing an optional hardmask 126. A trench is etched in the low-k dielectric layer 124 and then a barrier layer (e.g., Ta/TaN) and copper seed layer are deposited over the surface. Copper ECD (electrochemical deposition) may then be used to overfill the trench with copper. Finally, copper CMP (chemical-mechanical polish) is performed to planarize the surface and remove the excess copper and barrier materials, resulting in the structure of FIG. 2A.

Still referring to FIG. 2A, an electrically conductive material 140 is deposited over the surface of top metal interconnect level 104. Preferably, material 140 comprises a material that also acts as a diffusion barrier to copper to prevent copper from diffusing out from metal interconnect lines 104a, 104b. In the preferred embodiment, material 140 comprises TaN. Suitable materials include TaN, TiN, Ir, Ru, Ta, and sandwiches/multi-layer combinations thereof. For example, instead of entirely comprising a copper diffusion barrier, the bottom electrode may instead comprise bilayers in which only one of the layers comprises a copper diffusion barrier. Specifically, the bottom electrode may comprise a TaN layer with a TiN layer as the dielectric interface.

Figure 2B:
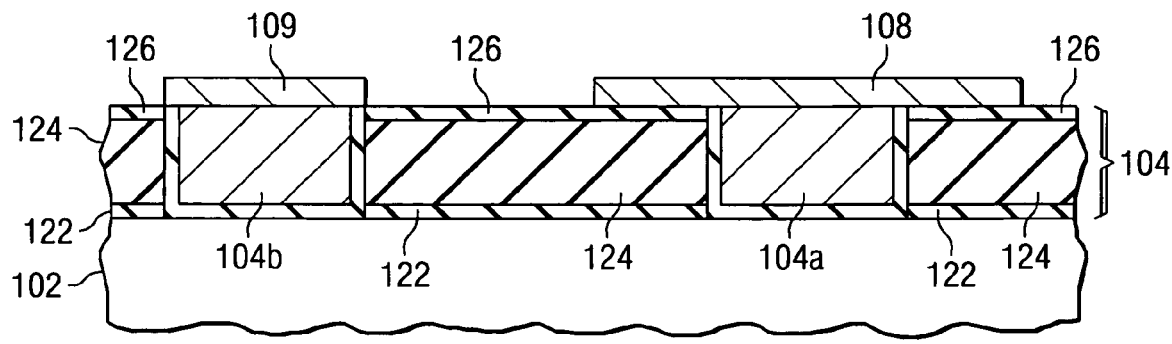

A pattern 134 is formed over material 140. Pattern 134 covers the area where high density capacitor 106 will be formed. In addition, pattern 134 covers all of the metal interconnect lines (104a, 104b and other, not shown) of the topmost interconnect level 104. The exposed portions of material 140 are removed by etching to form bottom electrode 108 and cladding 109, as shown in FIG. 2B. Because the surfaces of all of the copper lines are protected by cladding 109, no degradation of the copper lines occurs. After the etch, pattern 134 is removed.

Next, a capacitor dielectric 110 is formed over bottom electrode layer 108. Preferably, capacitor dielectric 110 comprises a high dielectric constant material such as tantalum-oxide. A high dielectric constant material allows for a larger capacitance value to be formed in a smaller area. Other high-k dielectric materials such as hafnium oxide or less high-k dielectrics such as SiN may alternatively be used. In the preferred embodiment, a layer of tantalum-oxide 130 is deposited over bottom electrode material 108, as shown in FIG. 2B. The layer of tantalum-oxide 130 is then annealed in $O_2$ to reduce impurities in the tantalum-oxide 130 and increase the oxygen content, thus forming the capacitor dielectric 110 in FIG. 2C.

Figure 2C:
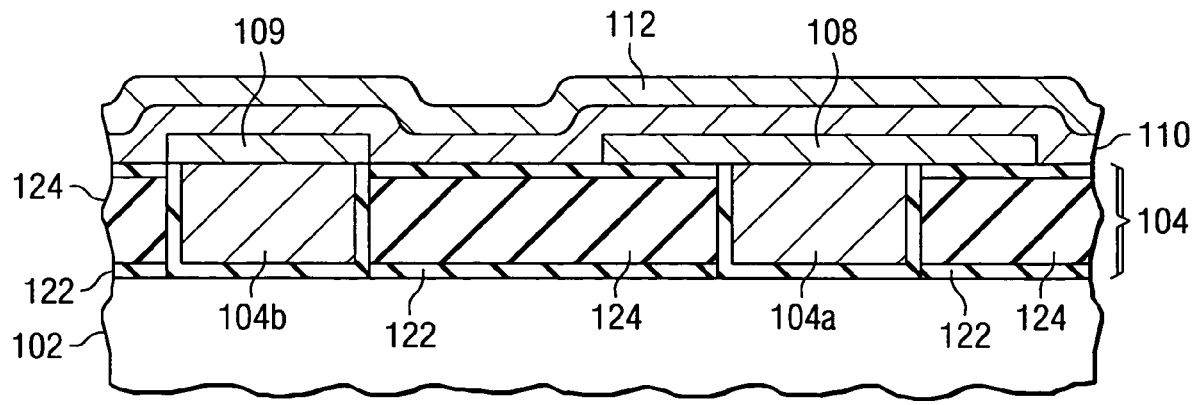

Still referring to FIG. 2C, the top electrode material 112 is deposited over the capacitor dielectric 110. The top electrode material 112 comprises an electrically conductive material and may comprise the same or a different material than bottom electrode material 108. In the preferred embodiment, top electrode material 112 comprises TaN or TiN.

Figure 2D:
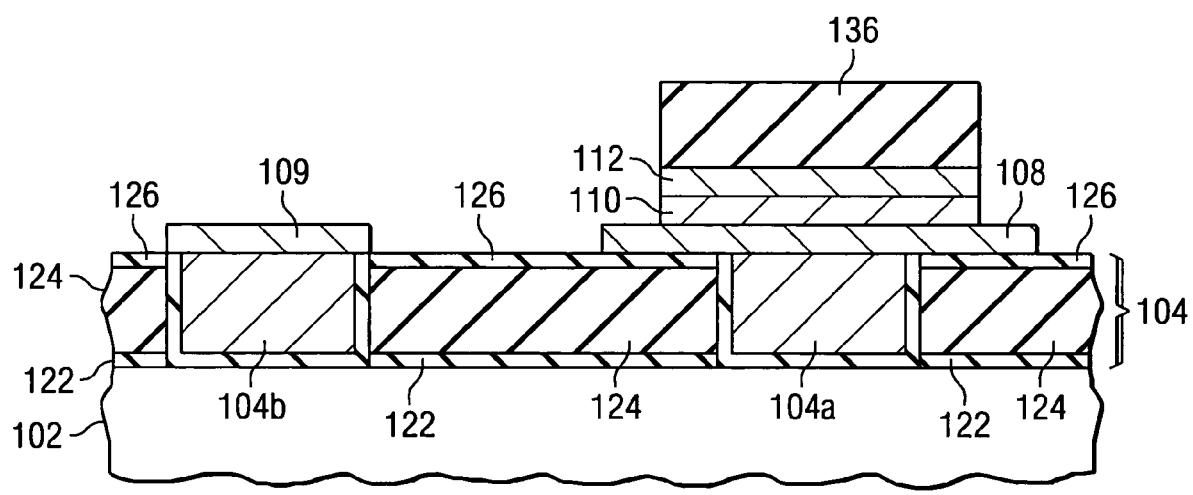

Next, a pattern 136 is formed over top electrode material 112, as shown in FIG. 2D. Pattern 136 covers the area where decoupling capacitors are desired. Top electrode material 112 and capacitor dielectric 110 are then etched, using pattern 136 to create high density capacitor 106. An etch that can etch the bottom electrode selectively with respect to the copper of metal interconnect liner 104b is not needed as the copper surface is protected by cladding 109. Because the copper surfaces are protected, no degradation of the Cu lines 104a, 104b occurs and topography is maintained. Pattern 136 is then removed.

Figure 2E:
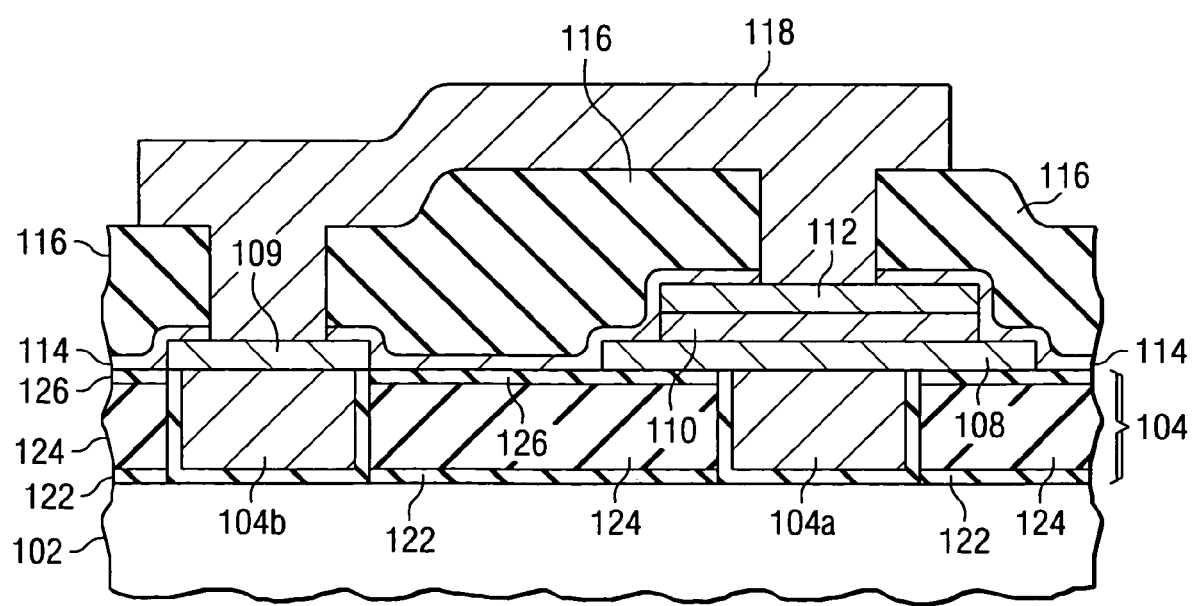

Referring to FIG. 2E, the protective overcoat 116 is deposited. In the preferred embodiment, an etchstop layer of SiN 114 is first deposited over the surface followed by the deposition of the protective overcoat 116. For example, protective overcoat 116 may comprise a silicon-oxynitride or oxide layer. Protective overcoat 116 and SiN 114 are then patterned and etched to expose a portion of bottom electrode material 108 over metal interconnect line 104b and a portion of top electrode 114 as well as all other areas of the device where external connections are desired (i.e., bondpad areas).

Figure 2F:
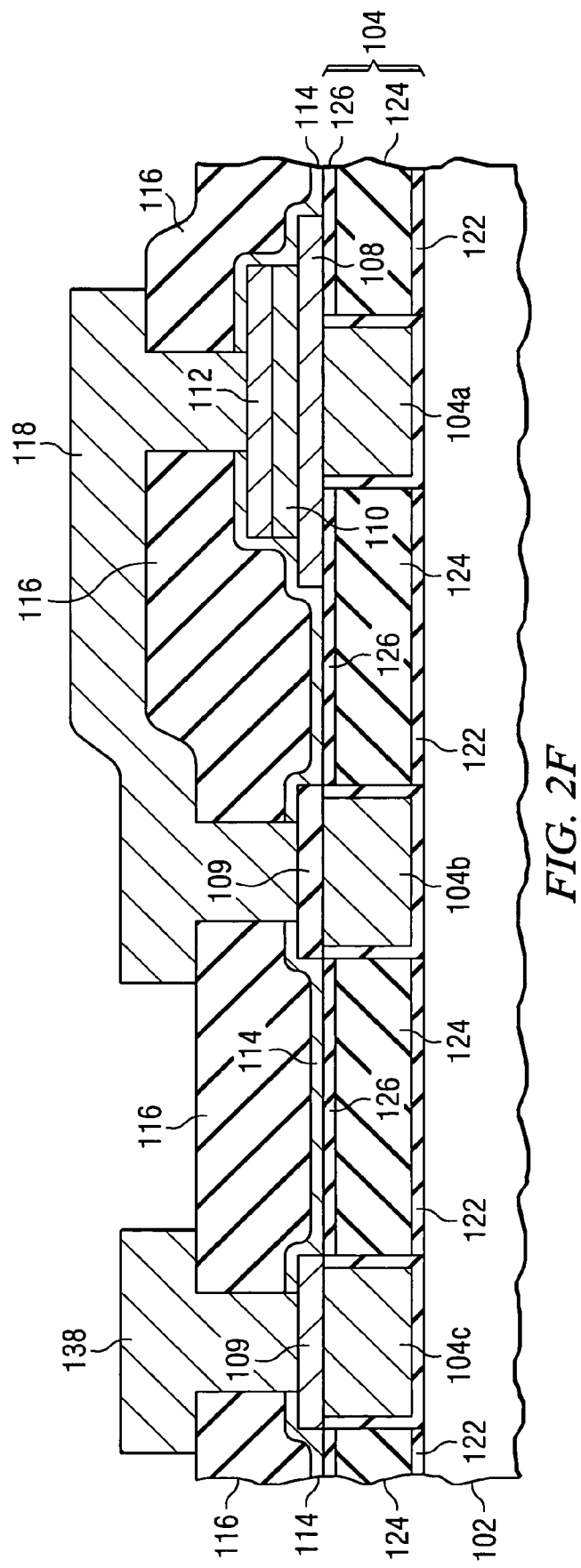

Still referring to FIG. 2E, a metal capping layer 118 is deposited over the structure. Typically, metal capping layer 118 comprises aluminum to improve adhesion of the bond wires typically applied during packaging. Metal capping layer 118 is patterned and etched to provide individual caps (i.e., unconnected) for each bondpad, as is known in the art. However, where decoupling capacitors are placed, metal capping layer 118 connects between the top electrode 112 and a neighboring metal interconnect line 104b. FIG. 2F, shows a third metal interconnect line 104c having a standard metal cap 138.

Processing then continues to package the semiconductor devices. During packaging, ball bonds and other bonding methods are used to connect the bondpads of a semiconductor device to the external pins of the integrated circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of fabricating an integrated circuit, comprising the following steps, performed in order:

providing a semiconductor body having a top metal interconnect level formed thereon, said top metal interconnect level having a first and a second metal interconnect line;

depositing a material over said top metal interconnect level;

patterning and etching said material to form a bottom electrode on said first metal interconnect line and a cladding on said second metal interconnect line;

forming a capacitor dielectric over said bottom electrode;

forming a top electrode over said capacitor dielectric;

forming a protective overcoat over said top electrode and said top metal interconnect level; and forming a conductive cap partially over said protective overcoat, said conductive cap electrically connecting said top electrode and said second metal interconnect line.

2. The method of claim 1, further comprising the steps of patterning and etching said capacitor dielectric layer and said top electrode layer to form a capacitor dielectric and top electrode, wherein said cladding protects said second metal interconnect line during said etching.

3. The method of claim 1, wherein said material and said top electrode layer each comprise TaN.

4. The method of claim 1, wherein said material and said top electrode layer each comprise one or more layers of material selected from the group consisting of TaN, TiN, Ru, Ir, and Ta.

5. The method of claim 1, wherein said capacitor dielectric layer comprises tantalum-oxide.

6. The method of claim 1, wherein said capacitor dielectric layer comprises hafnium-oxide or silicon nitride.

7. The method of claim 1, wherein said first and second metal interconnect lines comprise copper.

* * * * *